(12) United States Patent
Park

(10) Patent No.: US 10,193,492 B2
(45) Date of Patent: Jan. 29, 2019

(54) SOLAR CELL MODULE

(71) Applicant: LG INNOTEK CO., LTD., Seoul (KR)

(72) Inventor: Gi Gon Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 97 days.

(21) Appl. No.: 15/028,593

(22) PCT Filed: Oct. 9, 2014

(86) PCT No.: PCT/KR2014/009493
§ 371 (c)(1),
(2) Date: Apr. 11, 2016

(87) PCT Pub. No.: WO2015/053565
PCT Pub. Date: Apr. 16, 2015

(65) Prior Publication Data
US 2016/0254779 A1    Sep. 1, 2016

(30) Foreign Application Priority Data
Oct. 10, 2013 (KR) .................. 10-2013-0120503

(51) Int. Cl.
*H01L 31/049* (2014.01)
*H02S 30/10* (2014.01)
(Continued)

(52) U.S. Cl.
CPC .............. *H02S 30/10* (2014.12); *F24S 25/20* (2018.05); *F24S 40/44* (2018.05); *H01L 31/049* (2014.12); *Y02E 10/47* (2013.01)

(58) Field of Classification Search
CPC ........... H02S 30/10; F24S 40/44; F24S 25/20; H01L 31/049
See application file for complete search history.

(56) References Cited

U.S. PATENT DOCUMENTS 8,258,395 B2 * 9/2012 Wares .................... H02S 20/23
136/251
8,640,401 B2    2/2014 Hong et al.
(Continued)

FOREIGN PATENT DOCUMENTS

CN        1427939 A       7/2003
CN      201197123 Y       2/2009
(Continued)

OTHER PUBLICATIONS

Office Action dated May 4, 2017 in Chinese Application No. 201480067622.4.
(Continued)

*Primary Examiner* — Golam Mowla
(74) *Attorney, Agent, or Firm* — Saliwanchik, Lloyd & Eisenschenk

(57) ABSTRACT

A solar cell module according to an embodiment comprises: a solar cell panel; and a frame for accommodating the solar cell panel, wherein the frame comprises: a first sub-frame extending in one direction; a second sub-frame protruding and extending from the first sub-frame; a third sub-frame protruding and extending from the first sub-frame and disposed at the lower portion of the second sub-frame; and a fourth sub-frame protruding from the first sub-frame and extending in the direction opposite to the second sub-frame and the third sub-frame.

18 Claims, 5 Drawing Sheets

(51) Int. Cl.
*F24S 25/20* (2018.01)
*F24S 40/44* (2018.01)

(56) References Cited

U.S. PATENT DOCUMENTS

| | | | |
|---|---|---|---|
| 2003/0201009 A1* | 10/2003 | Nakajima | H02S 20/23 |
| | | | 136/251 |
| 2004/0154655 A1* | 8/2004 | Tanaka | F24S 40/44 |
| | | | 136/244 |
| 2005/0257453 A1 | 11/2005 | Cinnamon | |
| 2007/0295385 A1* | 12/2007 | Sheats | H01L 31/0392 |
| | | | 136/251 |
| 2008/0257402 A1* | 10/2008 | Kamp | F24J 2/5211 |
| | | | 136/251 |
| 2008/0302407 A1 | 12/2008 | Kobayashi | |
| 2009/0095339 A1 | 4/2009 | Nightingale | |
| 2010/0132274 A1 | 6/2010 | Reyal et al. | |
| 2011/0226335 A1* | 9/2011 | Naitoh | H02S 20/00 |
| | | | 136/259 |
| 2013/0019857 A1 | 1/2013 | Li et al. | |
| 2014/0360580 A1 | 12/2014 | Lee | |

FOREIGN PATENT DOCUMENTS

| | | | |
|---|---|---|---|
| CN | 101408064 A | 4/2009 | |
| CN | 101426988 A | 5/2009 | |
| CN | 201263129 Y | 6/2009 | |
| CN | 101743642 A | 6/2010 | |
| CN | 101802324 A | 8/2010 | |
| CN | 102891212 A | 1/2013 | |
| DE | 10-2011-119467 A1 | 5/2013 | |
| JP | 2008-255707 A | 10/2008 | |
| JP | 2010-251418 A | 11/2010 | |
| JP | 2013-002244 A | 1/2013 | |
| JP | 2013-170351 A | 9/2013 | |
| JP | 2013170351 * | 9/2013 | H01L 31/00 |
| KR | 10-1241514 A1 | 3/2013 | |
| KR | 10-1241514 B1 | 3/2013 | |
| KR | 10-2013-0051850 A | 5/2013 | |

OTHER PUBLICATIONS

International Search Report in International Application No. PCT/KR2014/009493, filed Oct. 9, 2014.

* cited by examiner

SOLAR CELL MODULE

CROSS-REFERENCE TO RELATED APPLICATIONS

This application is the U.S. national stage application of International Patent Application No. PCT/KR2014/009493, filed Oct. 9, 2014, which claims priority to Korean Application No. 10-2013-0120503 filed Oct. 10, 2013, the disclosures of each of which are incorporated herein by reference in their entirety.

TECHNICAL FIELD

The embodiment relates to a solar cell module.

BACKGROUND ART

Recently, as the depletion of an energy resource such as petroleum or coal is expected, the interest in the substitute energy has been more increased. In this regard, a solar cell converting solar energy into electrical energy has been spotlighted.

A solar cell (or photovoltaic cell) is a core element in solar power generation to directly convert solar light into electricity.

For example, if the solar light having energy greater than band-gap energy of a semiconductor is incident into a solar cell having a PN junction structure of a semiconductor, electron-hole pairs are generated. As electrons and holes are collected into an N layer and a P layer, respectively, due to the electric field formed in a PN junction part, photovoltage is generated between the N and P layers. In this case, if a load is connected to electrodes provided at both ends of the solar cell, current flows through the solar cell.

According to the solar cell, a solar cell panel may be fixed to a frame, and different frames having solar cell panels fixed thereto may be coupled to each other.

In this case, the coupling between the frames is not perfect, so that moisture may be infiltrated between the frames. Accordingly, moisture may be infiltrated into the solar cell panel.

In order to solve the above problem, the frames may be inclined at a predetermined angle, and connected with each other in overlap with each other. However, even in this case, the infiltration of moisture is not perfectly prevented.

Accordingly, there is a required a solar cell module having a novel structure capable of preventing moisture from being infiltrated into solar cell panels when the solar cell panels are connected with each other by the frames.

DISCLOSURE

Technical Problem

The embodiment provides a solar cell module having improved reliability by preventing moisture from being infiltrated into a solar cell module.

Technical Solution

According to the embodiment, the solar cell module includes a solar cell panel, and a frame to receive the solar cell panel. The frame includes a first sub-frame extending in one direction, a second sub-frame extending while protruding from the first sub-frame, a third second sub-frame extending while protruding from the first sub-frame and formed under the second sub-frame, and a fourth sub-frame protruding from the first sub-frame and extending in a direction opposite to directions of the second sub-frame and the third sub-frame.

Advantageous Effects

The solar cell modules according to the embodiment can include the fourth sub-frame to couple the solar cell modules to each other while maintaining a horizontal state.

According to the related art, the solar cell modules overlap with each other with frames inclined at a predetermined angle in order to prevent moisture from being infiltrated between the frames. However, when the solar cell modules overlap with each other, the solar cell modules are mechanically unstably coupled to each other, and require a significant amount of coupling cost since the frames are coupled to each other in the state that the frames are inclined.

In order to solve the above problem, according to the solar cell module of the embodiment, a coupling frame, that is, the fourth sub-frame is formed to couple the frames to each other in parallel to each other. Accordingly, when the solar cell modules are coupled to each other, the frames are coupled to each other while maintaining the horizontal state without being inclined, so that the solar cell modules can be joined to each other.

Therefore, according to the solar cell of the embodiment, when the solar cell modules are arranged, the solar cell modules need not be inclined for leakage protection. In addition, since the solar cell modules are joined to each other while maintaining the horizontal state, the solar cell modules can be easily assembled.

Accordingly, the solar cell module according to the embodiment can be easily assembled and have improved reliability.

BEST MODE

Mode for Invention

Figure 1:
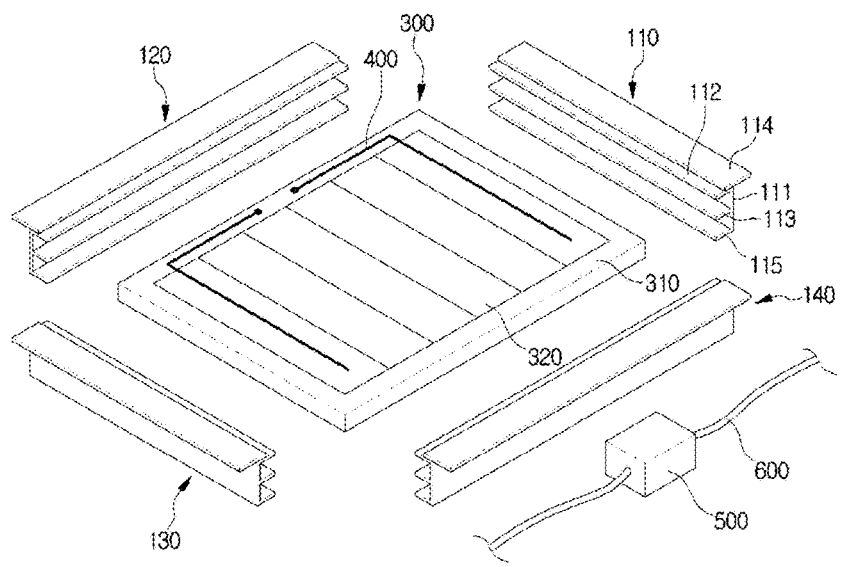
FIG. 1 is an exploded perspective view showing a solar cell module according to the embodiment.

In the following description of the embodiments, it will be understood that, when a layer (film), a region, a pattern or a structure is referred to as being "on" or "under" a substrate, another layer (film), another region, another pad or other patterns, it can be "directly" or "indirectly" on the other layer (film), region, pattern or structure, or one or more intervening layers may also be present. Such a position of each layer described with reference to accompanying drawings.

The thicknesses or sizes of each layer (film), region, pattern or structures shown in the drawings may be exaggerated for the purpose of explanation and clarity, and may not utterly reflect the actual size.

Hereinafter, the embodiments of the disclosure will be described in detail with reference to accompanying drawings.

Figure 2:
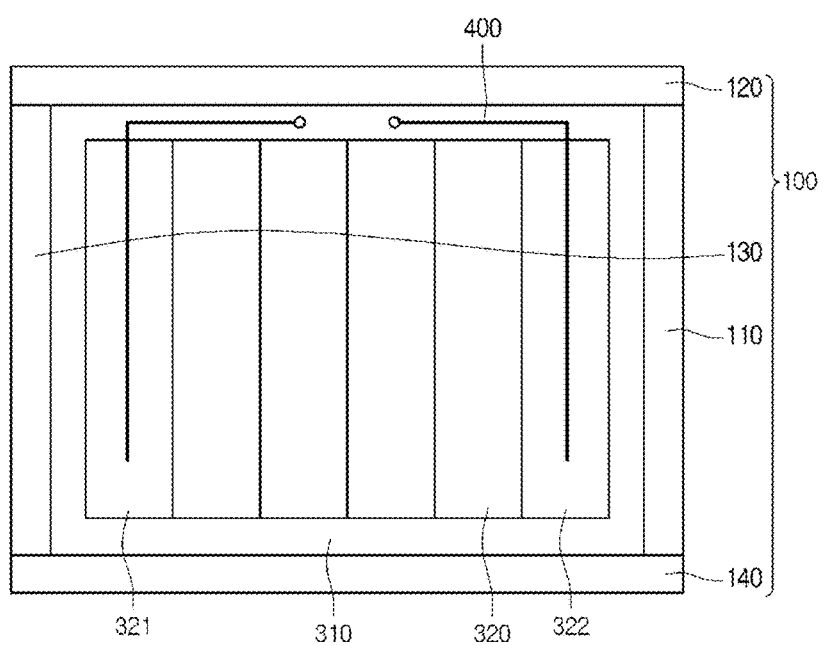
FIG. 2 is a plan view showing the solar cell module according to the embodiment.
Figure 3:
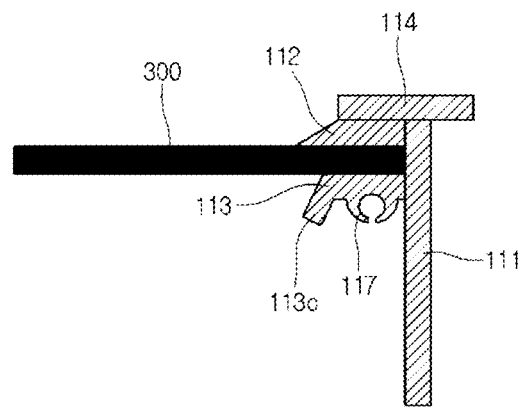
FIGS. 3 and 4 are side views showing a frame according to the embodiment.
Figure 4:
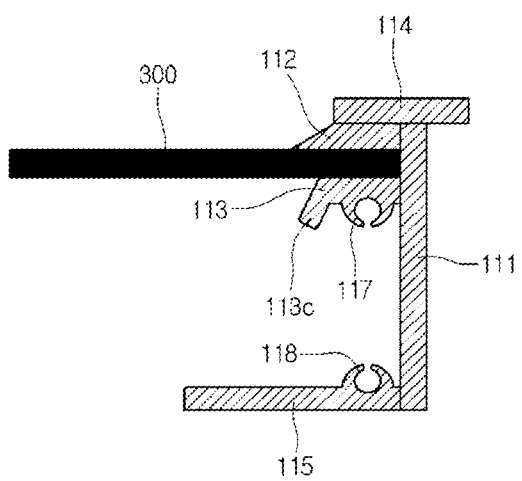
Figure 5:
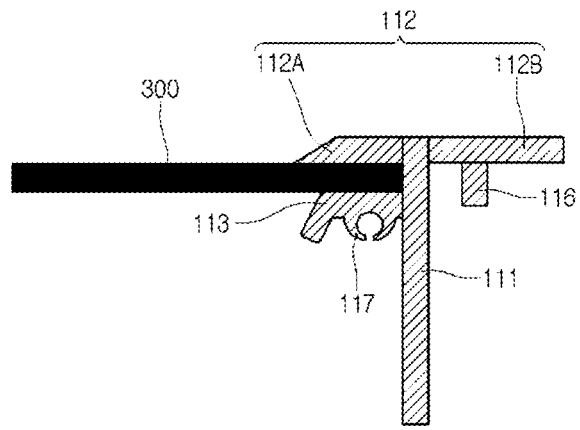
FIGS. 5 and 6 are side views showing a frame according to another embodiment.
Figure 6:
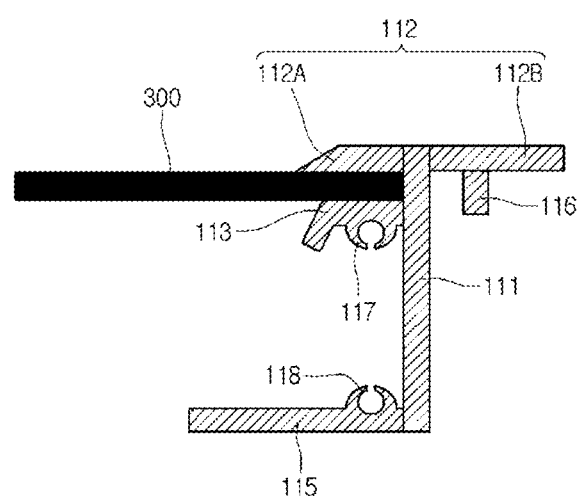
Figure 7:
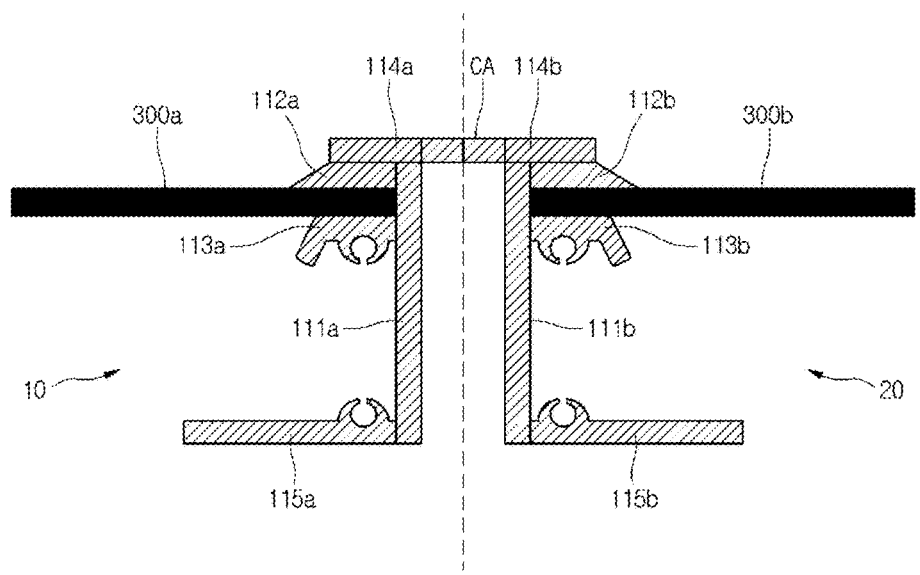
FIG. 7 is a side view showing the solar cell module coupled to the frame according to the embodiment.

Hereinafter, a solar cell module according to the embodiment will be described with reference to FIGS. 1 to 7. FIG. 1 is an exploded perspective view showing a solar cell module according to the embodiment. FIG. 2 is a plan view showing the solar cell module according to the embodiment. FIGS. 3 and 4 are side views showing a frame according to the embodiment. FIGS. 5 and 6 are side views showing a frame according to another embodiment. FIG. 7 is a side view showing the solar cell module coupled to the frame according to the embodiment.

Referring to FIGS. 1 to 7, the solar cell module according to the embodiment includes a solar cell panel 300, a plurality of frames to receive the solar cell panel 300, a bus bar 400 provided on the solar cell panel 300, a junction box 500 connected with the bus bar 400, and a cable 600 extending from the junction box 500.

The solar cell panel 300 may have a plate shape. The solar cell panel 300 may include a support substrate 310 and a plurality of solar cells 320 provided on the support substrate 310.

The support substrate 310 may include an insulator. The support substrate 310 may include a glass substrate, a plastic substrate, or a metallic substrate. In more detail, the support substrate 310 may include a soda lime glass substrate. Alternatively, the support substrate 310 may include a ceramic substrate including alumina, stainless steel, or polymer having flexibility. The support substrate 310 may be transparent. The support substrate 310 may be rigid or flexible.

For example, the solar cells 320 may include a CIGS-based solar cell, a silicon-based solar cell, a dye-sensitized solar cell, a group III-IV compound semiconductor solar cell, or a group III-V compound semiconductor solar cell.

The solar cells 320 may be arranged in a stripe form. In addition, the solar cells 320 may be arranged in various shapes including a matrix shape.

The bus bar 400 may be provided on the solar cell panel 300. The bus bar 400 may include at least two bus bars. The bus bar 400 may be connected with the solar cells 320. In detail, the bus bar 400 may be directly connected with the solar cells 320. In more detail, the bus bars 400 may be connected with outermost solar cells 321 and 322, respectively.

The bus bar 400 may include a conductive tape, or a conductive paste. The material constituting the bus bar 400 may include copper (Cu), silver (Ag), or aluminum (Al).

The solar cell 300 may be provided thereon with a protective film (not shown) to protect the solar cell panel 300 and an upper substrate (not shown).

The protective film is integrated with the solar cell panel 300 through a lamination process in the state that the protective film is provided on the solar cell panel 300. The protective film protects the solar cell panel 300 from corrosion caused by moisture infiltration and protects the solar cell panel 300 from being impacted. The protective film may include a material such as ethylene vinyl acetate (EVA). The protective film may be provided at a lower portion of the solar cell panel 300.

An upper substrate located on the protective film is formed of tempered glass representing high transmittance and having an anti-damage function. In this case, the tempered glass may include low iron tempered glass having the low content of iron. The inner lateral side of the upper substrate may be subject to embossing to increase the scattering effect of light.

The junction box 500 is provided under the solar cell panel 300. The junction box 500 may be attached to the bottom surface of the solar cell panel 300. The junction box 500 may include a diode, and may receive a circuit board connected with the bus bar 400 and the cable 600. In addition, the solar cell module according to the embodiment may further include a wire to connect the bus bar 400 with the circuit board. The cable 600 is connected with the circuit board and connected with another solar cell panel 300.

Referring to FIGS. 1 to 4, the frame may receive the solar cell panel 300. The frame may be provided outside the solar cell panel 300. In detail, the frame may include a first frame 110, a second frame 120, a third frame 130, and a fourth frame 140 provided outside the solar cell panel 300.

The first frame 110, the second frame 120, the third frame 130, and the fourth frame 140 are provided outside top, bottom, left and right sides of the solar cell panel 300 to receive the solar cell panel 300. In other words, the first frame 110, the second frame 120, the third frame 130, and the fourth frame 140 may surround lateral sides of the solar cell panel 300.

The first to fourth frames 110 to 140 may include metallic frames. In detail, the first to fourth frames 110 to 140 may include various metals such as aluminum (Al), stainless steel or iron (Fe).

The first to fourth frames 110 to 140 may include a plurality of sub-frames to support the frames. The first to fourth frames 110 to 140 may have shapes similar to each other, and the configuration of each frame will be described in detail below while focusing on the first frame 110.

The first frame 110 may include a plurality of sub-frames. In detail, the first frame 110 includes a first sub-frame 111 extending in one direction, a second sub-frame 112 extending while protruding from the first sub-frame 111, a third sub-frame 113 extending while protruding from the first sub-frame 111 and formed under the second sub-frame 112, and a fourth sub-frame 114 protruding from the first sub-frame 111 and extending in a direction opposite to directions of the second sub-frame 112 and the third sub-frame 113.

The first sub-frame 111 supports the second sub-frame 112, the third sub-frame 113, and the fourth sub-frame 114. For example, the second sub-frame 112, the third sub-frame 113, and the fourth sub-frame 114 may extend perpendicularly to an extension direction of the first sub-frame 111.

The second sub-frame 112 and the third sub-frame 113 extend in the same direction with respect to the first sub-frame 111. The second sub-frame 112 is at a predetermined distance from the third sub-frame 113. Accordingly, the solar cell panel 300 may be received between the second sub-frame 112 and the third sub-frame 113.

The fourth sub-frame 114 may be formed on the top surface of the second sub-frame 112. In detail, the fourth sub-frame 114 may make contact with the second sub-frame 112.

The first sub-frame 111 may extend in a direction different from extension directions of the second sub-frame 112 and the third sub-frame 113. In detail, the fourth sub-frame 114 may extend in a direction opposite to the extension directions of the second sub-frame 112 and the third sub-frame 113.

In addition, the fourth sub-frame 114 may be provided on a lateral side of the second sub-frame 112. In detail, the fourth sub-frame 114 may be aligned on the same plane with the second sub-frame 112. In other words, the fourth sub-frame 114 and the second sub-frame 112 may be flat top surfaces.

The second sub-frame 112 and the fourth sub-frame 114 may be separated from each other. The second sub-frame 112 and the fourth sub-frame 114 may be formed integrally with each other.

The fourth sub-frame 114 extends in a direction opposite the extension directions of the second sub-frame 112 and the third sub-frame 113. The fourth sub-frame 114 prevents moisture from being infiltrated into the solar cell module when the solar cell module is coupled to another solar cell module.

Referring to FIG. 7, a first solar cell module 10 including a solar cell panel 300a received between a second sub-frame 112a and a third sub-frame 113a and a second solar cell module 20 including a solar cell module 300b received between a second sub-frame 112b and a third sub-frame 113b are coupled to each other at a coupling area CA between a fourth sub-frame 114a of the first solar cell module 10 and a fourth sub-frame 114b of the second solar cell module 20.

The fourth sub-frames 114a and 114b extending in a direction opposite to the extension directions of the second sub-frame and the third sub-frame may couple solar cell modules to each other.

According to the related art, the solar cell modules overlap with each other with frames inclined at a predetermined angle in order to prevent moisture from being infiltrated between the frames. However, when the solar cell modules overlap with each other, the solar cell modules are mechanically unstably coupled to each other, and require a significant amount of coupling cost since the frames are coupled to each other in the state that the frames are inclined.

Therefore, according to the solar cell module of the embodiment, a coupling frame, that is, the fourth sub-frame is formed to couple the frames to each other in parallel to each other. Accordingly, when the solar cell modules are coupled to each other, the frames are coupled to each other in parallel to each other without being inclined, so that the solar cell modules are joined to each other.

Therefore, according to the solar cell of the embodiment, when the solar cell modules are arranged, the solar cell modules need not be inclined for leakage protection. In addition, since the solar cell modules are joined to each other while maintaining a horizontal state, the solar cell modules may be easily assembled.

Therefore, the solar cell module according to the embodiment may be easily assembled and may have improved reliability.

The solar cell module according to the embodiment may include a fifth sub-frame 115 and/or a sixth sub-frame 116.

According to the fifth sub-frame 115 may be formed under the third sub-frame 113. The fifth sub-frame 115 may extend while protruding from the first sub-frame 111. The fifth sub-frame 115 may extend in the same direction as those of the second sub-frame 112 and the third sub-frame 113.

The sixth sub-frame 116 may be formed on a bottom surface of the fourth sub-frame 114. In detail, the sixth sub-frame 116 may be formed perpendicularly to the extension direction of the fourth sub-frame 114. The sixth sub-frame 116 may be formed separately from the fourth sub-frame 114. Alternatively, the sixth sub-frame 116 may be formed integrally with the fourth sub-frame 114.

The first sub-frame 111 may be formed separately from the sixth sub-frame 116. In other words, the first sub-frame 111 to the sixth sub-frame 116 may be formed detachably from each other. In addition, the first sub-frame 111 to the sixth sub-frame 116 may be formed integrally with each other.

The sixth sub-frame 116 is coupled to the fourth sub-frame 114 to adjust the interval between the fourth sub-frames 114 when the solar cell module is coupled to another solar cell module.

The third sub-frame 113 may include a bending part 113c extending downward, for example, in the direction of the fifth sub-frame 115.

For example, the bending part 113c may be bent at an angle of about 10° to about 80°. The bending part 113c may be formed integrally with the third sub-frame 113, or through an injection molding scheme.

The bending part 113c guides the location of the solar cell panel in the coupling of the solar cell panel. In other words, the solar cell panel 300 may be easily coupled between the second sub-frame 112 and the third sub-frame 113 by the bending part 113c.

The third sub-frame 113 and/or the fifth sub-frame 115 may be formed therein with a first hole 117 and a second hole 118, respectively. In detail, the first hole 117 may be formed in the bottom surface of the third sub-frame 113, and the second hole 118 may be formed in the top surface of the fifth sub-frame 115.

The first and second holes 117 and 118 are holes into which bolts for the coupling of the solar cell modules, that is, the frames are inserted.

Hereinafter, a solar cell module according to another embodiment will be described with reference to FIGS. 5 and 6. In the following description of the solar cell module according to the embodiment, the details of parts the same as or similar to those of the solar cell module according to the above-described embodiment will be omitted, and the same reference numerals will be assigned the same elements.

Referring to FIGS. 5 and 6, the solar cell module according to another embodiment includes a first sub-frame 111 extending in one direction, a second sub-frame 112 extending while protruding from the first sub-frame 111, and a third sub-frame 113 extending while protruding from the first sub-frame 111 and formed under the second sub-frame 112.

In addition, the second sub-frame 112 may include a first extension part 112A extending in a first direction to the first sub-frame 111 and a second extension part 112B extending in a second direction opposite to the first direction.

The first and second extension parts 112A and 112B may have flat top surfaces. In detail, the first and second extension parts 112A and 112B may be provided on the same plane.

In addition, the first extension part 112A may be provided separately from the second extension part 112B. In addition, the first extension part 112A and the second extension part 112B may be formed integrally with each other.

According to the solar cell module of the embodiment, the second sub-frame includes first and second extension parts extending in mutually different directions, that is, in directions opposite to each other. Accordingly, the second extension part may couple the solar cell module and another solar cell module to each other in parallel to each other similarly to the above-described fourth sub-frame when the solar cell module is coupled to another solar cell module.

Accordingly, the solar cell module according to another embodiment may be easily assembled and may have improved reliability as described above.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
a solar cell panel; and
a frame to receive the solar cell panel,
wherein the frame comprises:
a first sub-frame extending in one direction;
a second sub-frame extending while protruding from the first sub-frame;
a third sub-frame extending while protruding from the first sub-frame and formed under the second sub-frame;
a fourth sub-frame protruding from the first sub-frame and extending in a direction opposite to directions of the second sub-frame and the third sub-frame;
a fifth sub-frame extending while protruding from the first sub-frame and formed under the third sub-frame,
wherein the solar cell panel is received between the second sub-frame and the third sub-frame,
wherein the third sub-frame and the fifth sub-frame extend in a direction perpendicular to an extension direction of the first sub-frame;
a bending part located at an end of the third sub-frame, the bending part being spaced apart from the fifth sub-frame and extending toward the fifth sub-frame,
wherein the bending part is bent at an angle of 10° to 80° with respect to an extension direction of the third sub-frame;
a first hole formed on a bottom surface of the third sub-frame; and
a second hole formed on a top surface of the fifth sub-frame.

2. The solar cell module of claim 1, wherein the fourth sub-frame makes contact with a top surface of the second sub-frame.

3. The solar cell module of claim 1, wherein the second sub-frame is arranged on a same plane as that of the fourth sub-frame.

4. The solar cell module of claim 3, wherein the second sub-frame is formed integrally with the fourth sub-frame.

5. The solar cell module of claim 1, further comprising a sixth sub-frame formed on a bottom surface of the fourth sub-frame to extend perpendicularly to the fourth sub-frame.

6. The solar cell module of claim 5, wherein the first to sixth sub-frames are formed integrally with each other.

7. The solar cell module of claim 5, wherein at least one of the first to sixth sub-frames includes metal.

8. The solar cell module of claim 1, wherein the solar cell panel comprises a support substrate and a plurality of solar cells on the support substrate, and the solar cells include a CIGS-based solar cell, a silicon-based solar cell, a dye-sensitized solar cell, a group compound semiconductor solar cell, or a group III-V compound semiconductor solar cell.

9. The solar cell module of claim 1, further comprising:
a protective film on the solar cell panel; and
an upper substrate on the protective film.

10. The solar cell module of claim 1, wherein the frame comprises metal.

11. The solar cell module of claim 1,
wherein the second sub-frame comprises:
a first extension part extending in a first direction with respect to the first sub-frame; and
a second extension part extending in a second direction opposite to the first direction.

12. The solar cell module of claim 11, wherein the first extension part is arranged on a same plane as that of the second extension part.

13. The solar cell module of claim 12, wherein the first extension part is formed integrally with the second extension part.

14. The solar cell module of claim 1, wherein the frame comprises a first frame, a second frame, a third frame, and a fourth frame provided outside the solar cell panel; and
wherein the first frame, the second frame, the third frame, and the fourth frame each includes a plurality of sub-frames to support the frames.

15. The solar cell module of claim 1, wherein the solar cell panel comprises first and second solar cell panels that are spaced apart from each other,
wherein respective fourth sub-frames on the first and second solar cell panels are connected in the same plane.

16. The solar cell module of claim 8, wherein the support substrate is transparent.

17. The solar cell module of claim 8, wherein the support substrate is rigid or flexible.

18. The solar cell module of claim 8, further comprising a plurality of bus bars provided on the solar cell panel,
wherein a first bus bar of the plurality of bus bars is connected with a first outermost solar cell, and
wherein a second bus bar of the plurality of bus bars is connected with a second outermost solar cell.

* * * * *